United States Patent
Koon et al.

[19]

[11] Patent Number: 5,852,548
[45] Date of Patent: Dec. 22, 1998

[54] ENHANCED HEAT TRANSFER IN PRINTED CIRCUIT BOARDS AND ELECTRONIC COMPONENTS THEREOF

[75] Inventors: Robert W. Koon, Palos Verdes; Thomas E. Steelman, Torrance, both of Calif.

[73] Assignee: Northrop Grumman Corporation, Los Angeles, Calif.

[21] Appl. No.: 304,018

[22] Filed: Sep. 9, 1994

[51] Int. Cl.$^6$ ..................................................... H05K 7/20
[52] U.S. Cl. .................... 361/704; 29/890.03; 165/80.2; 165/80.3; 165/185; 174/16.3; 361/690; 361/719; 361/720
[58] Field of Search .................. 29/890.03; 361/690, 361/704–706, 708, 719, 720; 165/80.2, 80.3, 181, 185; 174/16.3

[56] References Cited

U.S. PATENT DOCUMENTS

| | | | |
|---|---|---|---|
| 3,706,127 | 12/1972 | Oktay et al. | 29/890.03 |
| 4,485,429 | 11/1984 | Mittal | 361/699 |
| 4,837,664 | 6/1989 | Rodriguez, II et al. | 361/386 |
| 4,849,858 | 7/1989 | Grapes et al. | 361/388 |
| 4,867,235 | 9/1989 | Grapes et al. | 165/185 |
| 5,002,715 | 3/1991 | Grapes et al. | 264/162 |
| 5,077,637 | 12/1991 | Martorana et al. | 361/386 |
| 5,150,748 | 9/1992 | Blackmon et al. | 165/185 |
| 5,287,248 | 2/1994 | Montejano | 361/708 |
| 5,316,080 | 5/1994 | Banks et al. | 361/707 |
| 5,358,032 | 10/1994 | Arai et al. | 361/703 |

FOREIGN PATENT DOCUMENTS

| | | | |
|---|---|---|---|
| 2811218 | 9/1979 | Germany | 174/16.3 |

OTHER PUBLICATIONS

Potente H. and Gabler K. A New Method for Flocking Plastic in Institut fur Kunstsoffverarberitung Hochschuke Aachen (No Known date).
Pontstr. 49, pp. 249–266 D–1500 Aachen West Germany, vol. I. No. 3, 1981.
Prof. Dr. A. Wehlow. the technique of flocking–Resurgence of a textile sector. (No known date).
Bolgen, Stig W. Flocking Technology. Journal of Coated Fabrics pp. 123–131, vol. 21, Oct. 1991.

*Primary Examiner*—Gregory Thompson
*Attorney, Agent, or Firm*—Terry J. Anderson; Karl J. Hoch, Jr.

[57] ABSTRACT

A structure for providing an enhanced heat transfer capability in a circuit board having electronic components and which is at least in part cooled by a gas flowing around the board. The enhanced heat transfer structure includes thermally conductive fibers attached at a first end to at least a portion of the exterior surfaces of the circuit board and/or electronic components thereof. The fibers extend out from the aforementioned exterior surfaces in a generally perpendicular direction, and are used to conduct heat from the circuit board and/or electronic components, and transfer it to the surrounding gas. Electrostatic fiber flocking methods are employed to attached the fibers in the aforementioned perpendicular orientation. It is also preferred that these thermally conductive fibers are carbon fibers, and attached to the exterior surface of the circuit board by a layer of adhesive. The enhanced heat transfer structure can be incorporated during the assembly of the board, or where the circuit board is an existing unit, the thermally conductive fibers can be attached without removing electronic components disposed thereon. Thus existing circuit boards can be retrofitted.

8 Claims, 1 Drawing Sheet

ENHANCED HEAT TRANSFER IN PRINTED CIRCUIT BOARDS AND ELECTRONIC COMPONENTS THEREOF

BACKGROUND OF THE INVENTION

1. Technical Field

This invention relates to gas-cooled printed circuit boards incorporating an enhanced heat transfer structure, and more particularly to such circuit boards wherein the enhanced heat transfer structure includes flocked carbon fibers.

2. Background Art

Electronic modules containing printed circuit boards are often cooled, at least in part, by blowing a gas such as air, over the boards. Cooling is required because heat is typically generated by electronic components on the printed circuit boards. When the gas flows around these electronic components, heat is transferred to the gas by convection. Thereafter, the heated gas is exhausted from the module. However, these types of gas-cooled electronic systems often exhibit operational power limits dictated by the rate at which heat can be dissipated from temperature critical components on the circuit boards. These power limitations can result in lower system performance. Therefore, if the rate of heat transfer could be increased, the operational power might be increased, and system performance improved.

Attempts at enhancing the heat transfer in gas-cooled electronic systems have been made in the past. For the most part, heat transfer rates have been increased by increasing the effective heat transfer surface area of the temperature sensitive electronic components. Thus, more heat can be transferred to the gas per unit of time. One way of increasing this surface area has been to attach "pin fins" to the top of the temperature sensitive components. As shown in FIG. 1, a pin fin 12 is a structure having a base 14 which supports rows of upright pins 16. Pin fins 12 are made of a thermally conductive material which draws heat away from an underlying temperature sensitive component. This heat is then transferred to the gas flowing around the base 14 and pins 16 of the pin fin 12. The effective heat transfer surface area of the pin fin 12 is much larger than that of the electronic component to which it is attached due to the added surface area afforded by the pins 16. However, the increase in heat transfer is limited to the number and size of pins 16 that can be formed on the base 14 of the pin fin 12. Current methods for producing state-of-the-art pin fins can not optimize the number and size of the pins to maximize heat transfer rates. In addition, they can be expensive.

Therefore, what is needed is a way of inexpensively increasing the effective heat transfer surface area of temperature sensitive electronic components over that available from current state-of-the-art pin fins.

SUMMARY

Wherefore, it is an object of the present invention to provide an enhanced heat transfer structure to printed circuit boards wherein the effective heat transfer area is increased over that currently available using pin fins.

Wherefore, it is another object of the present invention to provide an enhanced heat transfer structure to printed circuit boards wherein the effective heat transfer area is increased at a lower cost than currently available using state-of-the-art pin fins.

Wherefore, it is yet another object of the present invention to provide an enhanced heat transfer structure to printed circuit boards wherein the structure can cover the entire circuit board, or be limited to specific area thereof.

Wherefore, it is still another object of the present invention to provide an enhanced heat transfer structure to printed circuit boards wherein the structure can be incorporated onto an existing circuit board without removing installed electronic components.

The foregoing objects have been attained by a structure for providing an enhanced heat transfer capability in a circuit board having electronic components and which is at least in part cooled by a gas flowing around the board. The enhanced heat transfer structure includes thermally conductive fibers attached at a first end to an exterior surface of the circuit board and jutting out generally perpendicular to the exterior surface. These fibers are used to conduct heat from the circuit board and transfer it to the gas. It is preferred that the thermally conductive fibers be carbon fibers. The fibers are attached to the circuit board by electrostatic fiber flocking methods. These methods allow long, thin thermally conductive fibers to be densely deposited across the surface of the circuit board. The resulting structure exhibits an effective heat transfer area exceeding that of currently available pin fins. Thus, the heat transfer rate can be increased over that of the pin fins. In addition, the fiber flocking processes are relatively simple and inexpensive when compared to the cost to manufacture state-of-the-art pin fins. Therefore, the aforementioned increase in the effective heat transfer area can be accomplished at a lower cost.

The fibers can be attached to the exterior surface of the circuit board by a layer of adhesive. It is desirable to optimize the thermal conductivity of this adhesive such that it is as high as possible, but not so high as to unacceptably degrade other desired properties of the material, such as its bond strength, electrical conductivity, and thermal expansion characteristics.

In addition, the fibers do not necessarily have to be attached to the entire circuit board. They may be attached to only a portion of it. In fact, where at least one of the electronic components of the circuit board is a temperature sensitive electronic component such that power input to this component can be increased in proportion to an increase in a rate of heat transfer therefrom, the thermally conductive fibers can be attached only to the portion of the circuit board constituting this temperature sensitive electronic component.

The above-described enhanced heat transfer structure can be applied to a circuit board, or an individual electronic board component, during the assembly of the board. Alternately, where the circuit board is an existing circuit board, the thermally conductive fibers can be attached without removing electronic components disposed on the circuit board. In this way existing circuit boards can be retrofitted with the enhanced heat transfer structure.

Accordingly, it can be seen that all the stated objectives of the invention have been accomplished by the above-described embodiments of the present invention. In addition, other objectives, advantages and benefits of the present invention will become apparent from the detailed description which follows hereinafter when taken in conjunction with the drawing figures which accompany it.

DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Preferred embodiments of the present invention will now be described with reference to the drawings.

Figure 2:
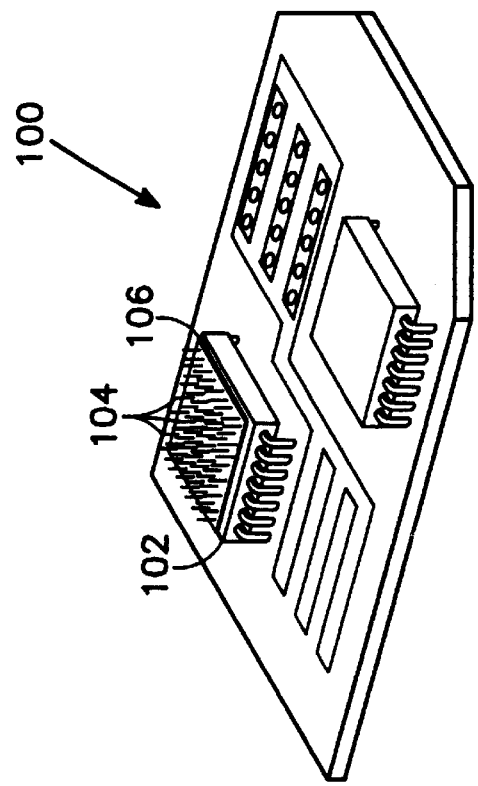
FIG. 2 is a perspective view of a printed circuit board having an electronic component with an enhanced heat transfer structure embodying the present invention disposed thereon.

FIG. 2 shows a printed circuit board 100 incorporating a temperature sensitive electronic component 102, i.e. in this case an integrated circuit chip. The top surface of the electronic component 102 is covered with thermally conductive fibers 104 generally disposed perpendicular to the surface of the component 102. The fibers 104 are attached by a layer of adhesive 106 disposed on top of the electronic component 102.

The fibers 104 are preferably carbon fibers. This preference stems from the fact that carbon fibers having high thermal conductivity are commercially available. For instance, vapor grown carbon fibers are available with thermal conductivity as high as about 3000 W/m-K. However, it should be noted that the cost of vapor grown carbon fibers is relatively high. Therefore, pitch based carbon fibers are preferred for applications where cost is also a concern. This type of fiber is not as thermally conductive as the aforementioned vapor grown fibers (i.e. on the order of 1000 W/m-K). However, the ratio of conductivity to cost is higher for pitch based fibers. In addition, carbon fibers will not corrode, as can metallic fibers. Corrosion can degrade the thermal conductivity of a metallic fiber.

The thermally conductive fibers 104 are attached to the top of the temperature sensitive component 102 via an electrostatic fiber flocking processes. In general, fiber flocking entails the application of fine fibers to the surface of an object in a generally upright orientation. Electrostatic flocking is a technique that uses an electric field to apply the fibers. An electrode gives the individual fibers an electric charge. Thereafter, the fibers become dipolar and orient longitudinally with the electric field lines. They are then drawn toward an opposite pole along the electric field lines. The opposing pole is placed on the side of the object being flocked opposite from the fiber charging electrode, or alternately, the opposing pole could be the object itself. In the case where a complex three-dimensional object is being flocked, the object itself is usually made the opposite pole since the electric field lines will intersect normal to the surface of the object. This ensures the fibers become embedded normal to the surface. This method will also work for flat surfaces, however, an electrode placed on the opposite side of the object from the fiber charging electrode can be positioned such that the fibers will impact the surface of the object in the desired perpendicular orientation, as well. For the circuit board applications of the present invention the latter method is preferred as it could be detrimental to the circuit components if the board itself, or an electronic board component, were made the opposing pole. Since printed circuit boards and most of the associated electronic components are essentially flat structures, the use of an offset pole presents no problems in regards to ensuring the fibers are imbedded in an upright position. It is also noted that the circuit board 100 and electronic components 102 should be properly protected from detrimental effects of the electric field during the fiber flocking process. Any appropriate method traditionally used to provide this type of protection may be employed.

Further refinements of the electrostatic flocking process have been developed to improve the perpendicularity of the fibers and the depth they are embedded into the adhesive. In addition, methods have been developed to ensure that the fibers flock uniformly over the surface and with a specific density. These refinements are particularly advantageous in connection with the present invention, and should be employed whenever possible. Some methods even eliminate the adhesive by using solvents to temporarily liquefy the surface of the object to be flocked. The surface to be flocked must, of course, be suitable for this method. For instance, the resin matrix material that typically forms the substrate on a printed circuit board would be a good candidate for this adhesive-free method. In general, the flocking process and the aforementioned improvements thereto do not form a novel part of the present invention. Therefore, a more detailed description other than what has been provided above, will not be presented herein. However, in regards to the present invention it is noted that the electrostatic flocking process for carbon fibers developed by Energy Science Laboratories, Inc. (ESLI) of San Diego, Calif., is particularly well suited for producing the printed circuit board with enhanced heat transfer embodying the present invention.

The fibers 104 shown in FIG. 2 can vary in length and diameter. In addition, the density of the fibers 104 across the surface of the component 102 can vary. Generally, these factors should be chosen to maximize the heat transfer rate of the system within the practical limits described below.

Variations in fiber length are partially dictated by their application. For instance, the circuit board 100 may be packed very tightly in a electronic module, thereby limiting the length of the fibers 104 so as to prevent their tops from touching another board 100 or the frame of the module. However, there are also upper and lower length limits imposed by the electrostatic flocking process itself. Currently, the flocking fiber size is limited to between about 0.050 and 0.250 inches. Therefore, the fibers 104 should be made as long as possible to maximize the effective heat transfer surface area, within the aforementioned application and fiber flocking process limits.

The fiber diameter should ideally be made as thin as possible. This follows because more numerous thinner fibers will have a greater combined surface area, than fewer thicker fibers. However, fiber diameters are also dictated by what is commercially available. The aforementioned vapor grown carbon fibers could conceivably be made with any desired diameter. However, custom made vapor grown carbon fibers are expensive. The pitch based fibers that are preferred when cost is a consideration, typically are available in specific diameters ranging from about 10 through 15 microns. Accordingly, the fiber diameter should be chosen so as to be as thin as possible, within the budget constraints that may exist.

The density of the fibers 104 over the surface of the component 102 is also restricted. It would be desirable to make the fibers 104 as dense as possible to increase their numbers, and so the heat transfer surface area. However, two other concerns must be addressed. First, current fiber flocking technology is capable of covering only about 0.01 to 6.0 percent of a surface with fiber. In addition, there is a point where the fibers 104 will become so dense that the gas flow is restricted and the heat transfer rate actually drops, rather than increases. This point will for the most part depend on the chosen length and diameter of the fibers. Accordingly, the aforementioned limiting factors must be balanced with the desire to maximize fiber density across the surface of the component 102, given a particular fiber length and diameter. Thus, the density should be chosen such that it is as high as possible, i.e. approaching 6 percent, but not so high as to degrade the heat transfer rate.

Figure 3:
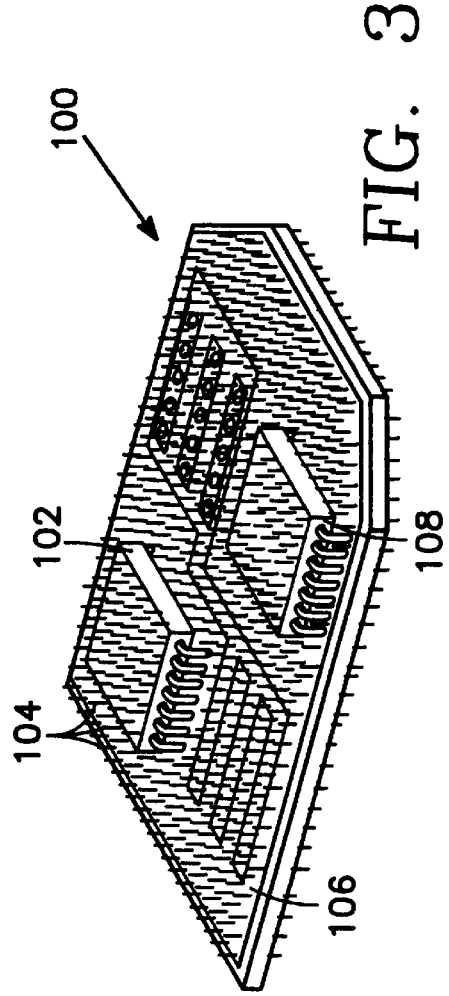
FIG. 3 is a perspective view of a printed circuit board having an enhanced heat transfer structure embodying the present invention covering the entire top and bottom of the board.
Figure 1:
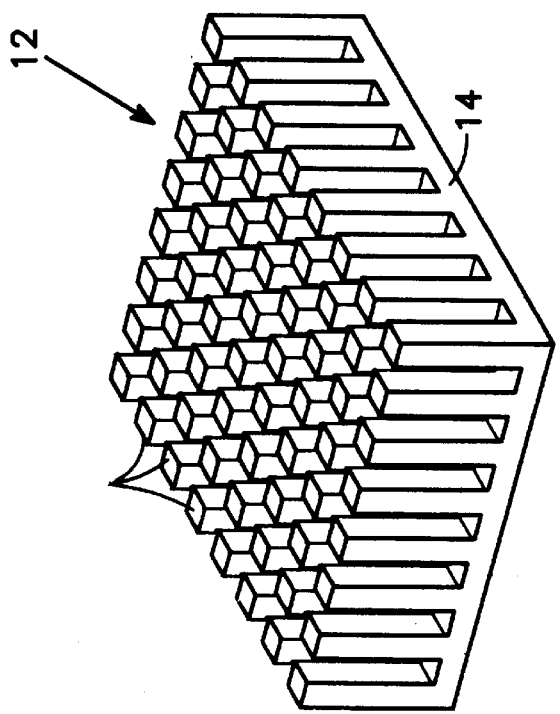
FIG. 1 is a perspective view of a conventional pin fin structure.

The foregoing discussion has concentrated on incorporating flocked fibers on temperature sensitive components of a printed circuit board. However, the present invention is not so limited. As shown in FIG. 3, fibers could also be flocked over portions of the board 100 itself, as well as the temperature sensitive components 102. This has the advantage of dissipating heat built up in the board 100 and non-temperature sensitive components 108. Thus, heat that could otherwise be conducted through the board 100 to the temperature sensitive components 102 would be eliminated, before it adds to the heat that must be transferred therefrom in order to maximize the power input. In this context, flocked fibers 104 could be added to the entire board 100, components 102, 108 and all, or any part of it. For example, a completely assembled printed circuit board could be covered top and bottom with the flocked fibers (as depicted in FIG. 3). This would provide for maximum heat transfer capability. Alternately, just the top, or bottom, or some portion thereof could have the flock fibers 104 incorporated. These latter versions might be better suited where the configuration of the finish electronic module would preclude complete fiber coverage. Of course, when the printed circuit board 100 is covered with flocked fibers, it is assumed a protective coating layer has been applied, to prevent the fibers from interfering with the operation of the circuit. This protective coating could be the adhesive 106 used to secure the fibers 104, if desired. It is also noted that in those cases where only a portion of the board is to be covered with flocked fibers 104, the excluded zones should be masked to prevent the fibers 104 from becoming lodged in the portion of the board 100 or electronic components 102, 108 associated with these areas, especially if no protective coating exists.

The adhesive 106 used to secure the fibers 104 would ideally be one which has as high a thermal conductivity as possible. However, it must be noted that there is typically a tradeoff between thermal conductivity of an adhesive and other of its desired properties. For instance, adhesives with extremely high thermal conductivity usually exhibit poor bond strength and high electrical conductivity. This could respectively result in fibers 104 being improperly secured, or the operation of the circuit being effected if not otherwise protected. In addition, it is desirable to match the thermal expansion characteristics of the adhesive 106 to that of the underlying circuit board 100. This could require the use of adhesive with a lower thermal conductivity. Accordingly, although it is desirable to maximize the thermal conductivity of the adhesive 106, other factors must be considered. Therefore, the thermal conductivity of the adhesive 106 should be optimized such that it is made as high as possible, but not so high as to unacceptably degrade other desired properties of the material.

This alternate embodiment of the present invention would also be advantageous for enhancing the heat transfer capabilities of pre-existing printed circuit boards. Instead of removing the temperature sensitive components 102 to separately add the flocked fibers 104, the entire board 100, or some portion thereof (e.g. even just the temperature sensitive components 102) would be flocked as described above. Thus, an existing circuit board could be retrofitted inexpensively and without significant risk of damage.

While the invention has been described in detail by reference to the preferred embodiment described above, it is understood that variations and modifications thereof may be made without departing from the true spirit and scope of the invention.

Wherefore, what is claimed is:

1. In a circuit board having electronic components and which is at least in part cooled by a gas flowing around the board, a method for providing an enhanced heat transfer capability, the method comprising the step of:

attaching thermally conductive fibers by a first end to at least a portion of some of the exterior surfaces of the circuit board and electronic components thereof, each of said fibers extending out from the exterior surfaces in a generally perpendicular direction so as to transfer heat to the gas.

2. The method for providing an enhanced heat transfer capability of claim 1, wherein the step of attaching the thermally conductive fibers comprises adhering the thermally conductive fibers to said exterior surfaces using a layer of adhesive.

3. A circuit board having an enhanced heat transfer capability, comprising:

(a) a circuit board with electronic components which is at least in part cooled by a gas flowing around the board; and, (b) a structure for providing an enhanced heat transfer capability, the structure comprising, thermally conductive fibers attached at a first end to at least a portion of some of the exterior surfaces of the circuit board and electronic components thereof, each of said fibers extending out from the exterior surfaces in a generally perpendicular direction so as to transfer heat to the gas.

4. The circuit board having an enhanced heat transfer capability of claim 3, wherein the thermally conductive fibers are attached to said exterior surfaces by a layer of adhesive.

5. The circuit board having an enhanced heat transfer capability of claim 3, wherein the thermally conductive fibers are carbon fibers.

6. In a circuit board at least in part cooled by a gas flowing around the board, and having electronic components comprising at least one temperature sensitive electronic component wherein power input to said temperature sensitive electronic component can be increased in proportion to an increase in a rate of heat transfer from the temperature sensitive electronic component to the gas, a method for providing an enhanced heat transfer capability, the method comprising the step of:

permanently attaching thermally conductive fibers to at least a portion of some of the exterior surfaces of the at least one temperature sensitive electronic component by adhering the thermally conductive fibers to said exterior surfaces using a layer of adhesive, each of said fibers extending out from the at least a portion of some of the exterior surfaces in a generally perpendicular direction so as to transfer heat to the gas.

7. The circuit board having an enhanced heat transfer capability of claim 6, wherein the thermally conductive carbon fibers are attached to said at least a portion of some of the exterior surfaces by a layer of adhesive.

8. A circuit board having an enhanced heat transfer capability, comprising:

(a) a circuit board with electronic components which is at least in part cooled by a gas flowing around the board, and wherein at least one of the electronic components of the circuit board is a temperature sensitive electronic component such that power input to said temperature sensitive electronic component can be increased in proportion to an increase in a rate of heat transfer from the temperature sensitive electronic component to the gas; and, (b) a structure for providing an enhanced heat transfer capability, the structure comprising thermally conductive carbon fibers permanently attached at a first end to at least a portion of some of the exterior surfaces of the at least one temperature sensitive electronic component, each of said fibers extending out from the at least a portion of some of the exterior surfaces in a generally perpendicular direction so as to transfer heat to the gas.

* * * * *